(12) United States Patent
Jiang et al.

(10) Patent No.: US 10,748,956 B2
(45) Date of Patent: *Aug. 18, 2020

(54) PHOTOSENSITIVE IMAGING DEVICES AND ASSOCIATED METHODS

(71) Applicant: SiOnyx, LLC, Beverly, MA (US)

(72) Inventors: Jutao Jiang, Tigard, OR (US); Jeffrey McKee, Tualatin, OR (US); Martin U. Pralle, Wayland, MA (US)

(73) Assignee: SiOnyx, LLC, Beverly, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/290,756

(22) Filed: Mar. 1, 2019

(65) Prior Publication Data

US 2019/0206923 A1    Jul. 4, 2019

Related U.S. Application Data

(63) Continuation of application No. 15/674,136, filed on Aug. 10, 2017, now Pat. No. 10,229,951, which is a
(Continued)

(51) Int. Cl.
*H01L 27/146* (2006.01)
*H01L 25/16* (2006.01)
(Continued)

(52) U.S. Cl.
CPC ...... *H01L 27/14649* (2013.01); *H01L 25/167* (2013.01); *H01L 27/1461* (2013.01); *H01L 27/1464* (2013.01); *H01L 27/14612* (2013.01); *H01L 27/14625* (2013.01); *H01L 27/14645* (2013.01); *H01L 27/14647* (2013.01); *H04N 5/2256* (2013.01); *H04N 5/3765* (2013.01);
(Continued)

(58) Field of Classification Search
CPC .......... H01L 27/1464; H01L 27/14625; H01L 27/14645; H01L 27/1461; H01L 27/14647; H01L 27/14612; H01L 27/14649; H01L 27/14689; H01L 27/14609; H01L 27/14643; H01L 31/0232; H01L 31/02327; H01L 27/146; H01L 27/14627; H04N 5/2256; H04N 5/37452; H04N 5/3765; H04N 9/045
USPC ....................................................... 250/330
See application file for complete search history.

(56) References Cited

U.S. PATENT DOCUMENTS 4,593,313 A * 6/1986 Nagasaki ............. A61B 1/0005
348/230.1
4,617,593 A * 10/1986 Dudley .................... H04N 5/33
250/332
(Continued)

*Primary Examiner* — Taeho Jo
(74) *Attorney, Agent, or Firm* — Nelson Mullins Riley & Scarborough LLP; Thomas J. Engellenner; Reza Mollaaghababa

(57) ABSTRACT

A monolithic sensor for detecting infrared and visible light according to an example includes a semiconductor substrate and a semiconductor layer coupled to the semiconductor substrate. The semiconductor layer includes a device surface opposite the semiconductor substrate. A visible light photodiode is formed at the device surface. An infrared photodiode is also formed at the device surface and in proximity to the visible light photodiode. A textured region is coupled to the infrared photodiode and positioned to interact with electromagnetic radiation.

19 Claims, 11 Drawing Sheets

Related U.S. Application Data continuation of application No. 14/245,872, filed on Apr. 4, 2014, now Pat. No. 9,741,761, which is a continuation of application No. 13/091,969, filed on Apr. 21, 2011, now Pat. No. 8,692,198.

(60) Provisional application No. 61/326,489, filed on Apr. 21, 2010.

(51) Int. Cl.
  *H04N 5/376* (2011.01)
  *H04N 9/04* (2006.01)
  *H04N 5/3745* (2011.01)
  *H04N 5/225* (2006.01)

(52) U.S. Cl.
  CPC ......... *H04N 5/37452* (2013.01); *H04N 9/045* (2013.01); *H01L 2924/0002* (2013.01)

(56) References Cited

U.S. PATENT DOCUMENTS

| | | | | |
|---|---|---|---|---|
| 4,751,571 A * | 6/1988 | Lillquist | | G01J 5/48 250/330 |
| 5,373,182 A * | 12/1994 | Norton | | H01L 31/02327 257/440 |
| 5,410,168 A * | 4/1995 | Hisa | | H01L 27/14609 257/188 |
| 5,808,350 A * | 9/1998 | Jack | | G01J 5/10 257/184 |
| 6,107,618 A * | 8/2000 | Fossum | | H01L 25/167 250/208.1 |
| 6,379,979 B1 * | 4/2002 | Connolly | | H01L 27/14647 257/E27.135 |
| 7,075,079 B2 * | 7/2006 | Wood | | G01J 3/36 250/332 |
| 7,442,629 B2 * | 10/2008 | Mazur | | H01L 21/302 438/487 |
| 2002/0019105 A1 * | 2/2002 | Hattori | | H01L 21/76256 438/311 |
| 2002/0024618 A1 * | 2/2002 | Imai | | H04N 9/3114 348/743 |
| 2002/0134939 A1 * | 9/2002 | Giedd | | G01J 5/04 250/338.1 |
| 2004/0048175 A1 * | 3/2004 | Bobeck | | B41M 5/38207 430/30 |
| 2004/0256561 A1 * | 12/2004 | Beuhler | | G01J 3/2803 250/339.05 |
| 2005/0127401 A1 * | 6/2005 | Mazur | | H01L 31/068 257/200 |
| 2005/0200473 A1 * | 9/2005 | Noguchi | | G08B 29/046 340/507 |
| 2005/0225749 A1 * | 10/2005 | Kong | | G06F 3/0317 356/218 |
| 2006/0214121 A1 * | 9/2006 | Schrey | | G01S 17/894 250/559.38 |
| 2006/0257140 A1 * | 11/2006 | Seger | | B60Q 1/14 396/429 |
| 2007/0063219 A1 * | 3/2007 | Sa'ar | | B82Y 20/00 257/189 |
| 2007/0076481 A1 * | 4/2007 | Tennant | | H01L 27/1465 365/185.14 |
| 2007/0125951 A1 * | 6/2007 | Snider | | G06K 9/3233 250/363.03 |
| 2008/0095440 A1 * | 4/2008 | Onishi | | G06K 9/22 382/181 |
| 2008/0309913 A1 * | 12/2008 | Fallon | | A61H 3/061 356/4.01 |
| 2009/0009596 A1 * | 1/2009 | Kerr | | G01S 1/70 348/117 |
| 2009/0050807 A1 * | 2/2009 | Ota | | H04N 5/2354 250/338.1 |
| 2009/0200589 A1 * | 8/2009 | Qian | | H01L 27/14641 257/292 |
| 2009/0256156 A1 * | 10/2009 | Hsieh | | H01L 27/14609 257/72 |
| 2010/0039217 A1 * | 2/2010 | Borlez | | G08B 13/196 340/5.7 |
| 2010/0052088 A1 * | 3/2010 | Carey | | H01L 21/26513 257/436 |
| 2010/0072349 A1 * | 3/2010 | Veeder | | H01L 27/14609 250/208.1 |
| 2010/0102206 A1 * | 4/2010 | Cazaux | | H01L 27/14603 250/208.1 |
| 2010/0102366 A1 * | 4/2010 | Lee | | H01L 27/14609 257/291 |
| 2010/0289885 A1 * | 11/2010 | Lu | | H04N 5/2258 348/61 |
| 2011/0049365 A1 * | 3/2011 | Aebi | | H01L 27/14643 250/332 |
| 2011/0155911 A1 * | 6/2011 | Claytor | | G01J 1/06 250/338.3 |
| 2012/0274744 A1 * | 11/2012 | Wan | | G01S 17/10 348/46 |

* cited by examiner

PHOTOSENSITIVE IMAGING DEVICES AND ASSOCIATED METHODS

PRIORITY DATA

The present application claims priority as a continuation application of U.S. patent application Ser. No. 15/674,136, filed on Aug. 10, 2017, which claims priority as a continuation of U.S. patent application Ser. No. 14/245,872, filed on Apr. 4, 2014, now patented as U.S. Pat. No. 9,741,761, which claims priority as a continuation of U.S. patent application Ser. No. 13/091,969, filed on Apr. 21, 2011, now patented as U.S. Pat. No. 8,692,198, which claims the benefit of U.S. Provisional Patent Application Ser. No. 61/326,489, filed on Apr. 21, 2010, all of which are incorporated herein by reference.

BACKGROUND

Many security systems use radiation from light emitting diodes or laser diodes or other laser sources for illuminating objects of interest. In particular, laser designator systems are used to designate targets for many military and law enforcement applications. For a typical laser designator system, a near infrared (NIR) 1064 nm laser diode is often used. The laser is normally modulated at, for example, pulse durations as short as 10 ns, pulse repetition rates as high as 20 kHz, and with as little as 25 µJ per pulse. Various conventional focal plane array (FPA) technologies can be used for detecting the 1064 nm laser from a laser designator system. Typically, the laser provides a laser spot on the target and an FPA detects the laser spot with an imager such as an indium gallium arsenide (InGaAs) imager, a mercury cadmium telluride (HgCdTe) imager, a thick-epi CMOS (Complementary metal-oxide-semiconductor) imager, or a charge-couple device (CCD).

A problem with using a conventional imager to provide a see-spot capability for a laser designator system is capturing the reflected laser pulse energy. In order for the imager to capture the reflected laser pulse, the imager must be gated in time to coincide with the time of arrival of the reflected laser pulse from the designated target. By gating the imager to "detect" the laser spot and not allowing the charge wells to charge except when the laser return is expected, the imager sacrifices all surrounding (background) video imagery. In other words, the only thing that is often seen in the video frame is the laser spot itself, and imagery of any surrounding scenery is not captured. A resultant scene is often too dark to discern any details except for the spot because the charge wells within the FPA did not receive sufficient photons from the surrounding scenery to produce a useful image due to the limited gate time allotted to the laser pulse. In order to overcome this phenomenon, a separate sensor is normally used in the system capable of capturing the normal scene. The image output from those two separate sensors is digitally merged or fused into one composite image. Since the field-of-view (FOV) is not exactly same for the two sensors, there will be registration errors. This could pose serious problems for applications where high accuracy of aiming is desired.

SUMMARY

The present disclosure provides a monolithic sensor for detecting infrared and visible light. The sensor can include a semiconductor substrate and a semiconductor layer coupled to the semiconductor substrate. The semiconductor layer can have a device surface opposite the semiconductor substrate. A visible light photodiode can be formed at the device surface. An infrared photodiode can be formed at the device surface in proximity to the visible light photodiode. A light diffusing region can be coupled to the infrared photodiode and positioned to interact with electromagnetic radiation.

The present disclosure provides a system for detecting and combining infrared and visible light. The system can include a sensor. The sensor can include a semiconductor substrate and a semiconductor layer coupled to the semiconductor substrate. The semiconductor layer can have a device surface opposite the semiconductor substrate. A visible light photodiode can be formed at the device surface. An infrared photodiode can be formed at the device surface in proximity to the visible light photodiode. A textured region can be coupled to the infrared photodiode and positioned to interact with electromagnetic radiation. The system can further include an infrared light source operable to emit infrared light detectable by the infrared photodiode. The light source and the infrared photodiode can be co-located or separately located.

The present disclosure provides a method for creating a composite image of detected infrared and visible light with a monolithic sensor. The method can include detecting the visible light with the monolithic sensor as a visible light signal. The visible light signal can be transmitted to an image processing device. The infrared light can be detected with the monolithic sensor as an infrared light signal. Multiple detections of the infrared light can be integrated to create a combined infrared light signal. The combined infrared light signal can be transmitted to the image processing device. The method can further include integrating the combined infrared light signal and the visible light signal using the image processing device to create a composite image.

The present disclosure provides a photodiode pixel device. The device can include a plurality of rows of photodiodes for detecting impinging electromagnetic radiation and accumulating an electrical charge. A global transfer gate transistor can be coupled to the photodiodes for gating the photodiodes. An open state of the global transfer gate transistor can cause the electrical charge from the photodiodes to accumulate at an accumulation node. A transfer gate transistor can be coupled to the accumulation node for gating the accumulation node. An open state of the transfer gate transistor can cause the electrical charge from the accumulation node to accumulate as a signal at a floating diffusion node. A source follower transistor can be coupled to the floating diffusion node and configured to receive the signal from the floating diffusion node. The source follower transistor can amplify the signal. A row select gate transistor can be coupled to the source follower transistor. The row select gate transistor can read out the signal from successive rows of photodiodes. A reset gate transistor can be coupled between a voltage source and the floating diffusion node. An open state of the reset gate transistor can reset the electrical charge at the floating diffusion node. A global reset transistor can be coupled between the photodiodes and the voltage source. An open state of the global reset transistor can prevent accumulation of the electrical charge at the photodiodes.

The present disclosure provides a monolithic sensor for detecting infrared and visible light. The sensor can include a semiconductor substrate. A first pixel can be formed over the semiconductor substrate and a second pixel can be formed over the semiconductor substrate in proximity to the first pixel. The first pixel and the second pixel can have separate control logic and routing in the sensor.

BRIEF DESCRIPTION OF THE DRAWINGS

For a fuller understanding of the nature and advantage of the present invention, reference is being made to the following detailed description of preferred embodiments and in connection with the accompanying drawings, in which.

DETAILED DESCRIPTION

Figure 1A:
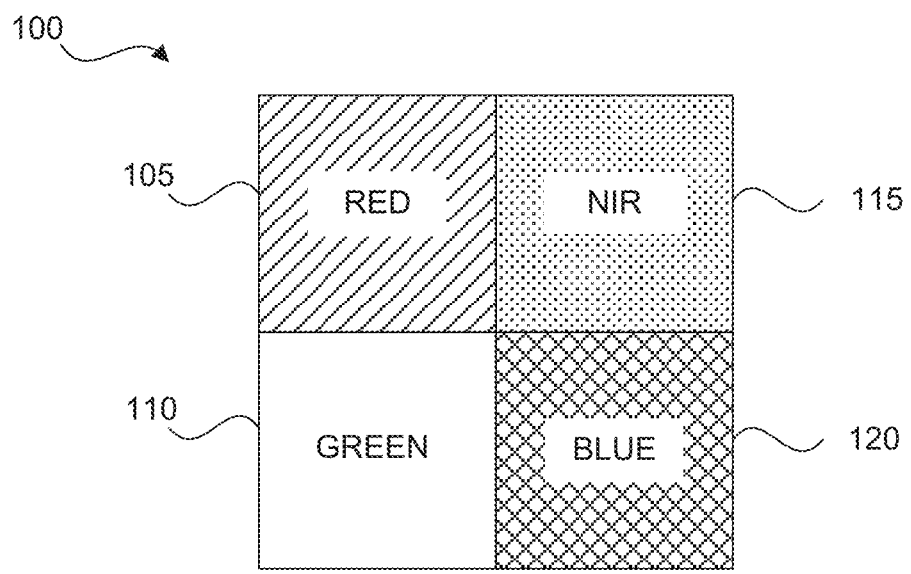
FIGS. 1a-1b are block diagrams illustrating an array of pixels in a pixel color pattern in accordance with one aspect of the present disclosure.

Before the present disclosure is described herein, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

Definitions

The following terminology will be used in accordance with the definitions set forth below.

It should be noted that, as used in this specification and the appended claims, the singular forms "a," and, "the" include plural referents unless the context clearly dictates otherwise. Thus, for example, reference to "a dopant" includes one or more of such dopants and reference to "the layer" includes reference to one or more of such layers.

As used herein, the terms "light" and "electromagnetic radiation" can be used interchangeably and can refer to light or electromagnetic radiation in the ultraviolet, visible, near infrared, and infrared spectra. The terms can further more broadly include electromagnetic radiation such as radio waves, microwaves, x-rays, and gamma rays. Thus, the term "light" is not limited to electromagnetic radiation in the visible spectrum. Many examples of light described herein refer specifically to electromagnetic radiation in the visible and infrared (and/or near infrared) spectra. For purposes of this disclosure, visible range wavelengths are considered to be from approximately 350 nm to 800 nm and non-visible wavelengths are longer than about 800 nm or shorter than about 350 nm. The infrared spectrum includes a near infrared portion of the spectrum including wavelengths of approximately 800 to 1100 nm, a short wave infrared portion of the spectrum including wavelengths of approximately 1100 nm to 3 micrometers, and a mid to long wave infrared (or thermal infrared) portion of the spectrum including wavelengths greater than about 3 micrometers up to about 30 micrometers. These are generally and collectively referred to herein as "infrared" portions of the electromagnetic spectrum unless otherwise noted.

As used herein, the terms "surface modifying" and "surface modification" refer to the altering of a surface of a semiconductor material using a variety of surface modification techniques. Non-limiting examples of such techniques include plasma etching, reactive ion etching, porous silicon etching, lasing, chemical etching (e.g. anisotropic etching, isotropic etching), nanoimprinting, material deposition, selective epitaxial growth, and the like, including combinations thereof. In one specific aspect, surface modification can include processes using primarily laser radiation or laser radiation in combination with a dopant, whereby the laser radiation facilitates the incorporation of the dopant into a surface of the semiconductor material. Accordingly, in one aspect surface modification includes doping of a substrate such as a semiconductor material. In one aspect, a semiconductor surface can be modified to become an absorption enhanced surface. Also, a surface modified surface can include, for example, a textured surface. As used herein, the term "textured surface" can refer to a surface having a topology with nano- to micron-sized surface variations formed by the irradiation of laser pulses or other texturing methods as are described herein. While the characteristics of such a surface can be variable depending on the materials and techniques employed, in one aspect such a surface can be several hundred nanometers thick and made up of nanocrystallites (e.g. from about 10 to about 50 nanometers) and nanopores. In another aspect, such a surface can include micron-sized structures (e.g. about 2 μm to about 60 μm). In yet another aspect, the surface can include nano-sized and/or micron-sized structures from about 5 nm and about 500 μm.

As used herein, the term "fluence" refers to the amount of energy from a single pulse of laser radiation that passes through a unit area. In other words, "fluence" can be described as the energy density of one laser pulse.

As used herein, the term "target region" refers to an area of a substrate that is intended to be doped or surface modified. The target region of the substrate can vary as the surface modifying process progresses. For example, after a first target region is doped or surface modified, a second target region may be selected on the same substrate.

As used herein, the term "detection" refers to the sensing, absorption, and/or collection of electromagnetic radiation.

As used herein, the term "backside illumination" refers to a device architecture design whereby electromagnetic radiation is incident on a surface of a semiconductor material that is opposite a surface containing the device circuitry. In other words, electromagnetic radiation is incident upon and passes through a semiconductor material prior to contacting the device circuitry.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Disclosure

The following disclosure provides electromagnetic imagers capable of detecting visible and infrared wavelengths. More specifically, the present disclosure sets out to resolve the current issue with simultaneously detecting a laser pulse from a laser designator and the surrounding scenery. The disclosure provides dual band monolithic imaging devices and methods of making and using such devices. In a specific implementation, a dual band monolithic imaging device may comprise an array of pixels arranged in a pattern. For example, the array pattern may include a repeating pattern of a combination of at least one red pixel, green pixel, and blue pixel, as well as at least one absorption enhanced near infrared pixel.

A monolithic CMOS imager is provided in one embodiment of the present invention. Such a CMOS imager comprises a CMOS sensing array having various different color pixels in combination with an infrared pixel arranged in a monolithic configuration. The infrared pixel may include a light diffusing or light scattering region formed on or near a surface of the pixel. One example of a light diffusing region is a textured region, such as a laser-textured region. Throughout this disclosure, the light diffusing region is referred to as a textured region for simplicity and ease of discussion. However, other forms of light diffusing or light scattering regions are also contemplated.

At least one of the red, green and blue pixels may include a textured region formed on or near the surface of the pixels. The textured region may be formed by a laser process as disclosed, for example, in U.S. Pat. Nos. 7,057,256, 7,354,792, and 7,442,629, which are incorporated by reference herein in their entirety. The textured region may comprise a semiconductor material, for example silicon, which is irradiated by a short pulse laser or other texturing technique to create modified micro-structured surface morphology. The textured semiconductor is made to have advantageous light-absorbing properties. In some cases this type of material has been called "black silicon" due to its visually darkened appearance after the laser processing and because of its enhanced absorption of light and IR radiation compared to other forms of silicon.

In one example, the textured region can be a laser processed textured region. In this example, the wavelength of the irradiating laser pulse for making black silicon, its fluence, and pulse duration can affect the morphology of the modified surface. In some embodiments, the laser fluence may be between about 1.5 kJ/m$^2$ and 12 kJ/m$^2$, but can vary depending on the substrate composition. The choice of the fluence of laser pulses irradiating a silicon wafer to generate a microstructured layer therein can also affect the gettering performance (capacity and/or specificity) of a microstructured substrate. In general, in various embodiments of the invention, the laser pulse fluence is selected to be greater than about 3 kJ/m$^2$. More preferably, the fluence may be chosen to be in a range of about 3 kJ/m$^2$ to about 10 kJ/m$^2$, or a range of about 3 kJ/m$^2$ to about 8 kJ/m$^2$.

Additionally, the laser pulse duration can affect the morphology and absorption properties of the modified semiconductor surface. Irradiation of a substrate can be with femtosecond laser pulses or picosecond or nanosecond pulses. Other factors that can affect surface morphology include laser polarization and laser propagation direction relative to the irradiated semiconductor surface.

In some embodiments, textured region can be doped with a dopant, either separately from or during the texturing process. For example, in the case of laser texturing, the laser radiation can be directed through a dopant material to incorporate the dopant into the texture region. For example, silicon can be laser textured in the presence of $SF_6$ in order to incorporate S into the textured region.

A more detailed description of an exemplary apparatus for detecting electromagnetic radiation or light in at least a range of wavelengths of the electromagnetic spectrum will now be provided. Additional detail regarding monolithic pixels and sensors can also be found in U.S. application Ser. No. 12/235,060, filed on Sep. 22, 2008, the contents of which is incorporated herein by reference in its entirety.

As illustrated in FIG. 1a, a basic pixel array arrangement 100 can include a red pixel (R) 105, a blue pixel (B) 120, and a green (G) pixel 110. with the pixel arrangement can further include a near-infrared (NIR) enhanced pixel 115. Much of the following description of the technology focuses on an array pattern including the RGB and NIR pixels for simplicity. However, the number and color configurations of the pixels in an array pattern can vary. Also, the following description focuses primarily on a NIR pixel for simplicity, but the NIR pixel may more broadly be an infrared pixel.

The near-infrared enhanced pixel may include a textured region formed on or near a surface of the pixel. The enhanced absorbing region may formed by the laser processing or other texturing methods referred to herein.

Figure 1B:
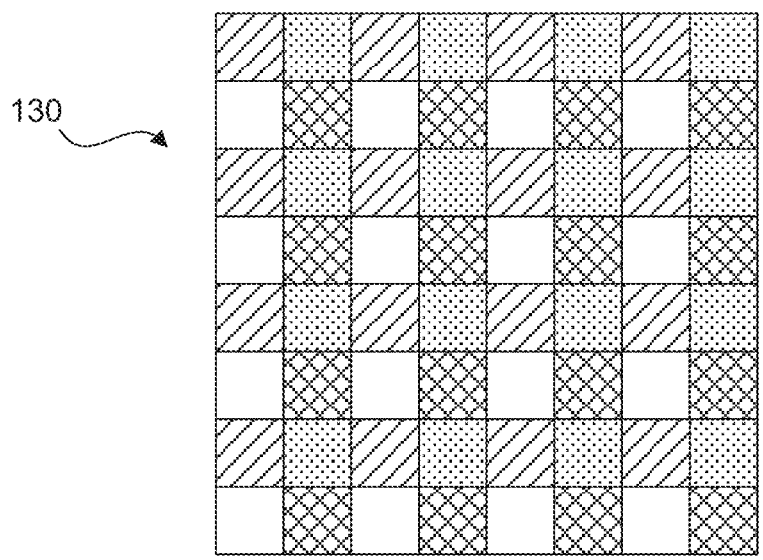

The pixel array may vary in pixel size and number of pixels. For example, the four pixels shown in FIG. 1a can represent a basic repeating pattern for a much larger pixel array 130, such as that shown in FIG. 1b. For a pixel array with a size of <2N>x<2M>, there will be N×M red pixels, N×M green pixels, N×M blue pixels and N×M NIR absorption enhanced pixels. Different variations of the illustrated pixel arrangement are also possible, depending on the desired application. For example, pixel color patterns other than RGBG may also be modified to include the NIR absorption enhanced pixels. Some specific examples can include RGBE (Red Green Blue Emerald), CYYM (Cyan Yellow Yellow Magenta), CYGM (Cyan Yellow Green Magenta), RGBW (Red Green Blue White), and so forth. Pixel color patterns can be modified by replacing an existing color pixel with the NIR absorption enhanced pixel or by adding the NIR absorption enhanced pixel to the pattern. Selection of pixel replacement, pixel pattern, and so forth will vary depending on the application.

The NIR absorption enhanced pixel is configured to detect NIR light. As one example, an NIR pixel can be configured to detect electromagnetic radiation at a wavelength of approximately 1064 nm. For example, an NIR pixel can include a 1064 nm narrow band pass filter to limit the light received by the NIR pixel at a wavelength of approximately 1064 nm. It is noted that the narrow band pass filter may not perfectly limit impinging light to 1064 nm wavelength light and that a slightly larger spectrum of wavelengths may impinge on the NIR pixel. In one aspect, the filter can be configured to transmit wavelengths of greater than approximately 1000 nm, greater than approximately 1050 nm, greater than approximately 1064 nm, greater than approximately 1100 nm, etc. It should be noted that the presently recited values include a range from the recited value up to the upper bandpass cutoff. In one specific aspect, the NIR pixel is selectively configured to absorb wavelengths corresponding to laser radiation emitted from a laser source. The NIR pixel can be configured to detect only NIR light while the RGB pixels can be configured to detect visible light.

As one example, some security systems include an infrared illumination source to illuminate the scene for improved imaging under low light conditions. Alternatively some systems include laser systems for designating military or law enforcement targets using a NIR 1064 nm laser source. Thus, for such applications, the NIR absorption enhanced pixel can be configured to detect light at least at the wavelength emitted from the laser/light source. In some applications, the NIR pixel can detect a broad range of wavelengths outside of the visible spectrum.

Radiation or light from the laser source may be modulated at a desired frequency, such as, for example, with pulse durations as short as 10 ns, pulse repetition rates as high as 20 kHz, and with as little as 25 µJ per pulse. Particularly during bright ambient light conditions, such as a sunny day, detection of NIR light by the NIR pixel may include noise from background electromagnetic radiation and identification of a laser signal out of the noise can be difficult. Accordingly, the NIR pixel can be configured to detect NIR light in substantial synchronization with the laser pulse.

In one embodiment, a time sequencing method is contemplated. In another embodiment, a method for sequencing a photo imager and a laser pulse is provided that includes the steps of determining the pulse duration and/or frequency of the laser pulse, synchronizing the imager time clock to capture photons from the laser at approximately the same frequency as the laser pulses, and outputting a readout signal from the imager in response to captured photons. In still another embodiment of the present invention, a method of synchronizing an imager and an external laser pulse via a global position system (GPS) clock is provided. Sequencing methods and systems will be described in additional detail below.

Figure 2:
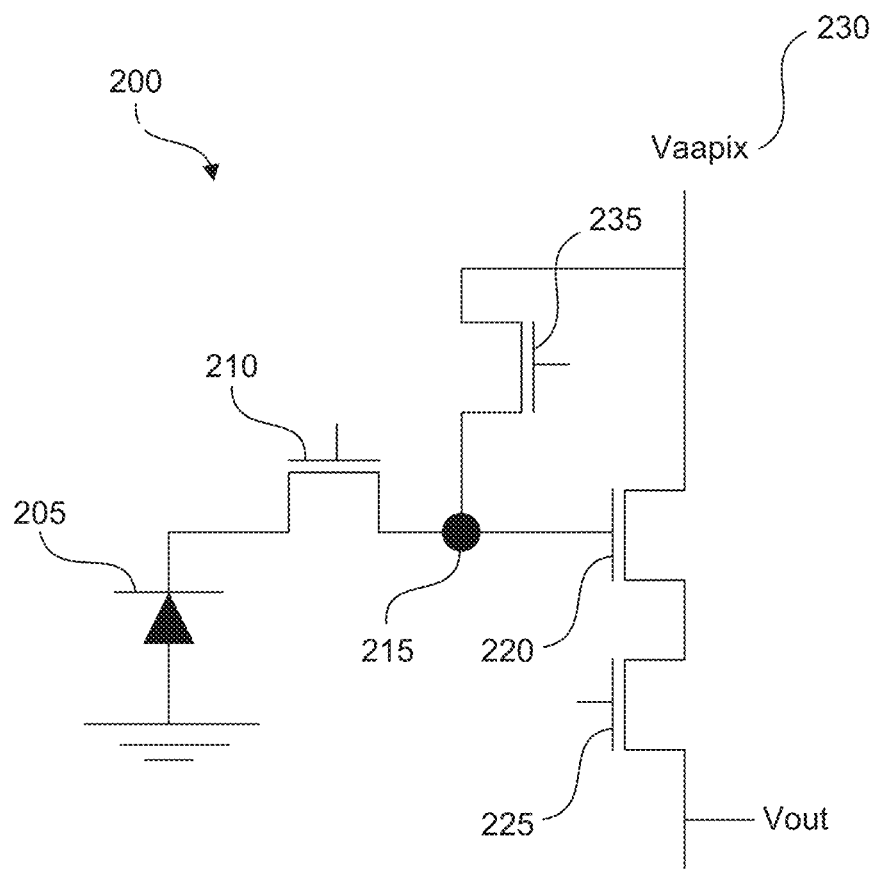
FIG. 2 is a schematic diagram of a four transistor diode for use with a photosensitive device in accordance with another aspect of the present disclosure.

Photosensitive or photo detecting imagers include photodiodes or pixels that are capable of absorbing electromagnetic radiation within a given wavelength range. Such imagers can be passive pixel sensors (PPS), active pixel sensors (APS), digital pixel sensor imagers (DPS), or the like, with one difference being the image sensor read out architecture. For example, in one aspect, a semiconducting photosensitive imager can be a three or four transistor active pixel sensor (3T APS or 4T APS). Various additional components are also contemplated, and may vary depending on the particular configuration and intended results. FIG. 2 illustrates a 4-transistor (4T) CMOS (complementary metal-oxide-semiconductor) pixel architecture 200. The 4T architecture may typically be used in a rolling shutter configuration for the visible light pixel(s) in a pixel array. Alternatively, the 4T architecture can be used in a global shutter configuration. A voltage (Vaapix) 230 can be supplied to the circuit or photodiode array. A photodiode 205 can accumulate electrons from the impingement of light on the photodiode. Electrons accumulated in the photodiode can be transferred to a floating diffusion (FD) node 215 by opening a transfer gate (TX) transistor 210. A voltage at the FD node changes as a result, and this change can be amplified by a source follower (SF) transistor 220 and read out as a voltage at Vout using a row selector RS transistor 225. The voltage or potential of the FD node can be reset using a reset (RST) transistor 235.

Figure 3:
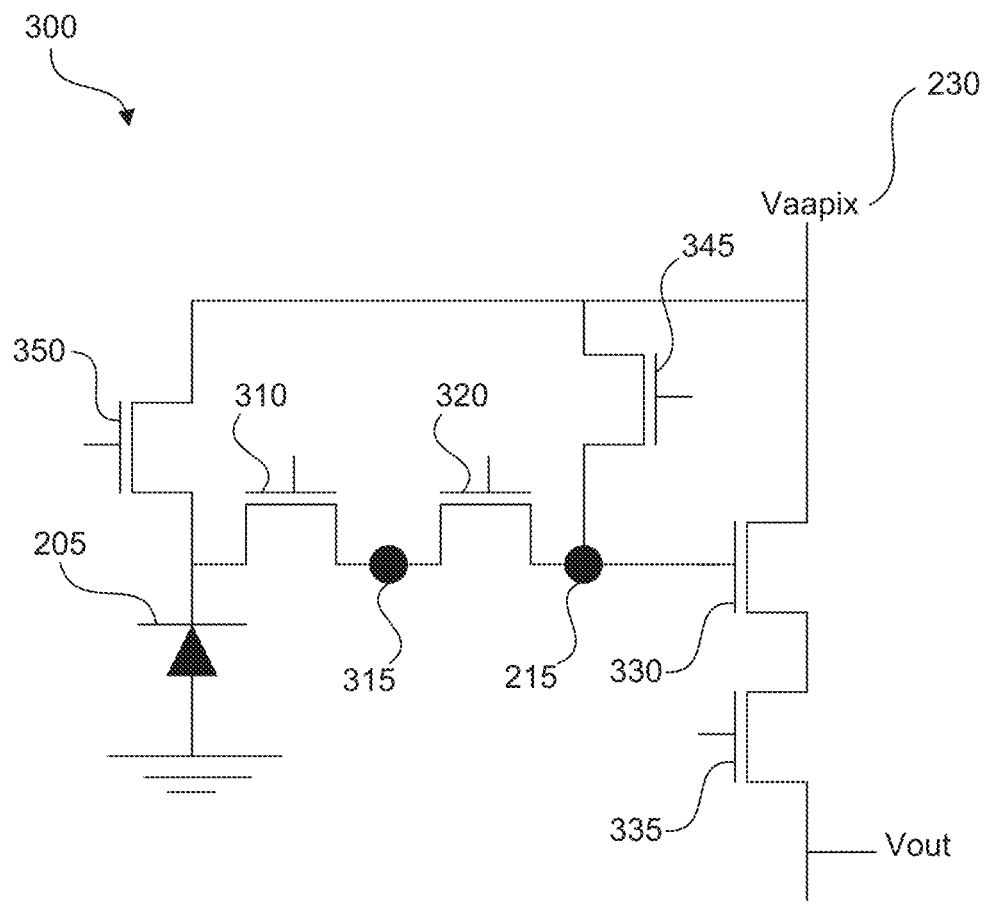
FIG. 3 is a schematic diagram of a six transistor diode for use with a photosensitive device in accordance with another aspect of the present disclosure.

FIG. 3 illustrates a 6-transistor (6T) CMOS pixel architecture 300 that can be used for the NIR pixel to synchronize light detection with a laser pulse. The 6T NIR pixel may have two extra transistors, including a global reset transistor (Global_RST) 350 and a global transfer gate transistor (Global_TX1) 310, in addition to the 4 transistors included in a 4T architecture (transfer gate (TX2) 320, reset gate (RST) 345, source follower (SF) 330, and row select gate (RS) 335). The 6T architecture can also include an accumulation node 315. In one aspect, the 6T architecture can enable a global shutter for the NIR pixel. The global shutter can expose NIR pixels in a pixel array substantially simultaneously for a predetermined period, which can be configured to substantially correspond with a laser pulse. At the start of exposure the NIR pixels in a sensor start gathering light. At the end of exposure, the light-gathering circuitry can be turned off and the contents of the sensor can be read out to become an image.

The NIR pixel array and RGB pixel array, or rather the NIR pixels in the array and the RGB pixels in the array, can have separate control logic and routing in the sensor. As described above, the RGB pixel array can have a rolling shutter operation for scene image capture. The NIR pixel array can use a global shutter to capture very short pulse laser spots even under bright ambient lighting conditions by beginning to integrate light prior to the laser pulse and discontinuing integration right after the laser pulse turns off. The NIR pixel array can operate globally with an internal device clock. A global shutter can allow simultaneous capture of an entire field of view of the array. Although the NIR pixel array can operate as a rolling shutter, as will be further described below, there may be a timing difference in each row of pixels captured when an imaging device is tracking a laser spot if a rolling shutter is used. The timing difference in some examples can complicate tracking the laser spot. Because the global shutter simultaneously captures an entire field of view, tracking difficulties in some applications can be avoided.

Figure 4:
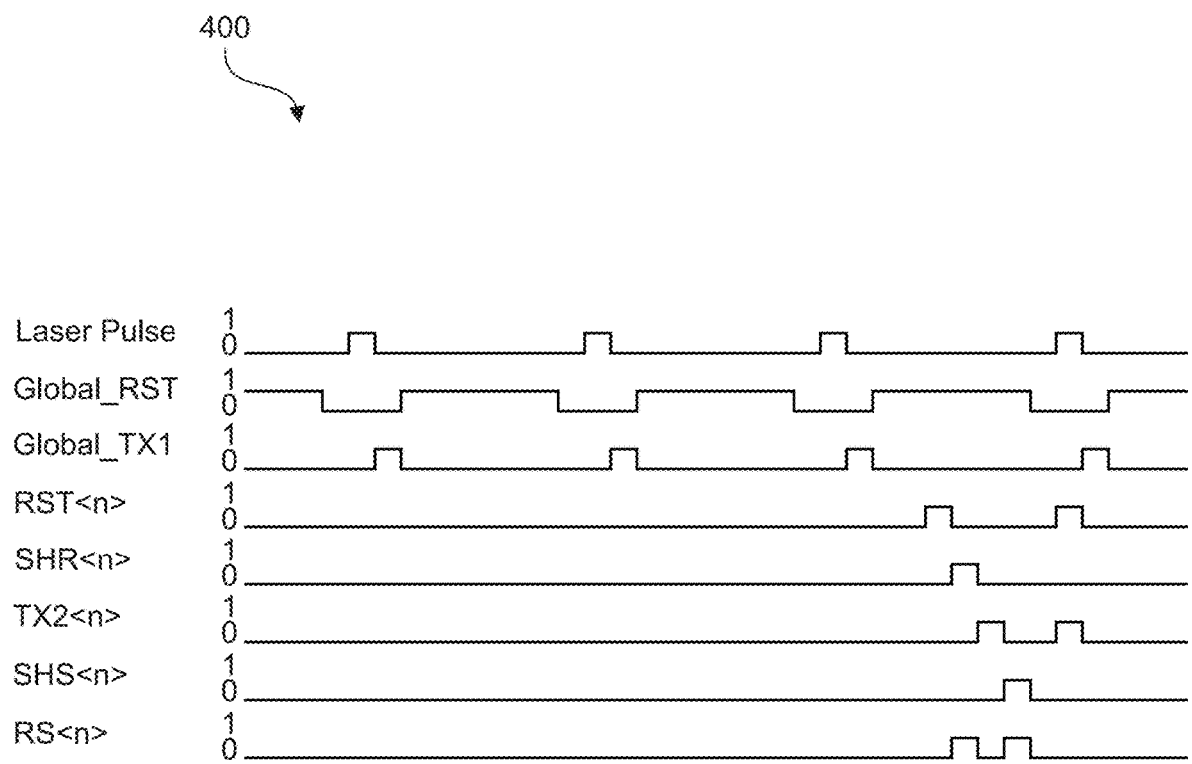
FIG. 4 is a diagram of a timing sequence of a six transistor diode for use with a photosensitive device in accordance with yet another aspect of the present disclosure.

The 6T architecture and the NIR pixel array operation can be further understood by reference to FIG. 4 and the following description. FIG. 4 illustrates an exemplary timing sequence 400 for a global shutter in a 6T architecture for capturing light from a laser pulse. The 0's and 1's next to the timing sequence indicate a low (0) or high (1) signal for each of the designated signals (i.e., laser pulse, global_RST, etc.). The <n>'s in the list of signals indicates the row address of a selected row.

The Global_RST and Global_TX1 transistors can operate substantially simultaneously on the NIR pixels. The Global_RST signal is high in-between the laser pulse and can hold the photodiodes of an NIR pixel at reset so that no signal integration will occur. The Global_RST signal changes to low right before the laser pulse so that the photodiodes of the NIR pixel will start to integrate charges generated by incident light. After the laser pulse turn off, the Global_TX1 is set to high to transfer the charge from the photodiodes to the accumulation node. After charge transfer, Global_RST is set to high again to hold the NIR pixel photodiodes at reset between laser pulses.

The above procedure can be repeated until the accumulated charge at the photodiodes is read out. The charge is summed at the accumulation node. The FD is reset (RST) and a reset signal is sampled as a sample and reset (SHR) signal. The charge is transferred from accumulation node to FD by turning on gate TX2. The signal is then sampled as a sample and hold (SHS) signal. The difference (RS) between SHR and SHS will be the final signal. The difference can be determined by, for example, a CDS (correlated double sampling) readout to remove kTC (thermal) noise. The final signal readout is operated on a row-by-row basis as with the 4T CMOS sensor architecture described above. After readout of the final signal, the accumulation node is reset by turn on RST and TX2 substantially simultaneously.

While the above method can be used for bright ambient light conditions, a different method may be used in different ambient light conditions, such as very low ambient light conditions or moon lighted conditions. For example, in low ambient light conditions both the NIR pixel and RGB pixels can operate in a rolling shutter mode. The 6T NIR pixel can operate in a rolling shutter mode by setting the Global_RST to low and constantly holding the Global_RST at low. The Global_TX1 gate can be tied with gate TX2 so that the Global_TX1 and TX2 gates can be operated substantially simultaneously.

Figure 5:
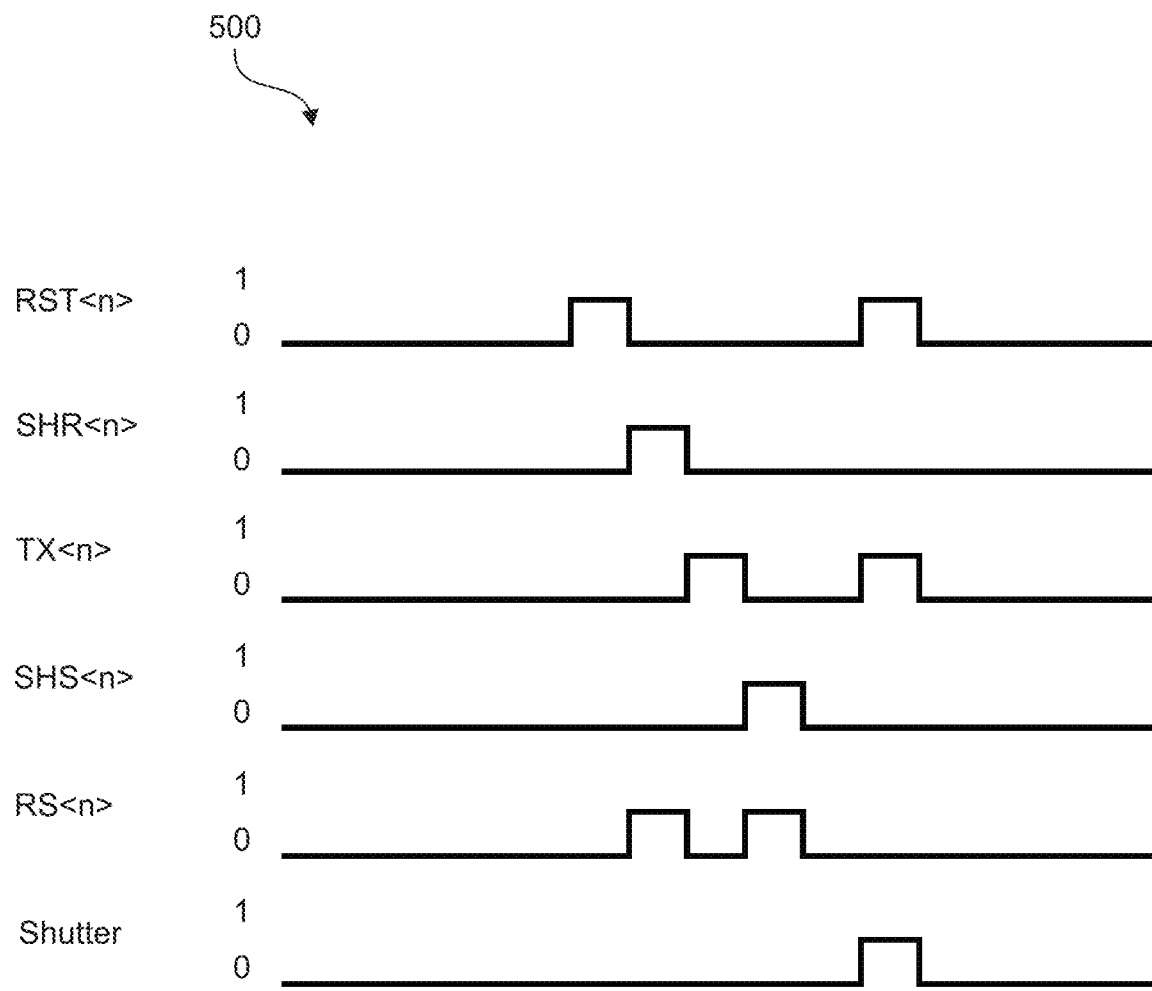
FIG. 5 is a diagram of a timing sequence of a four transistor diode for use with a photosensitive device in accordance with a further aspect of the present disclosure.

One example of a timing sequence 500 for the RGB 4T pixel array is illustrated in FIG. 5. The steps for readout timing can be briefly described. The signal readout is operated on a row-by-row basis as with many typical CMOS sensors. The FD reset (RST) and the reset signals are sampled as SHR. The charge from the photodiodes is transferred to FD by turning on TX. The signal is sampled as SHS. The difference between SHR and SHS is the final signal (e.g. CDS readout to remove kTC noise). After readout, a shutter operation is enabled by turning on RST and TX simultaneously for a given row address.

Figure 6A:
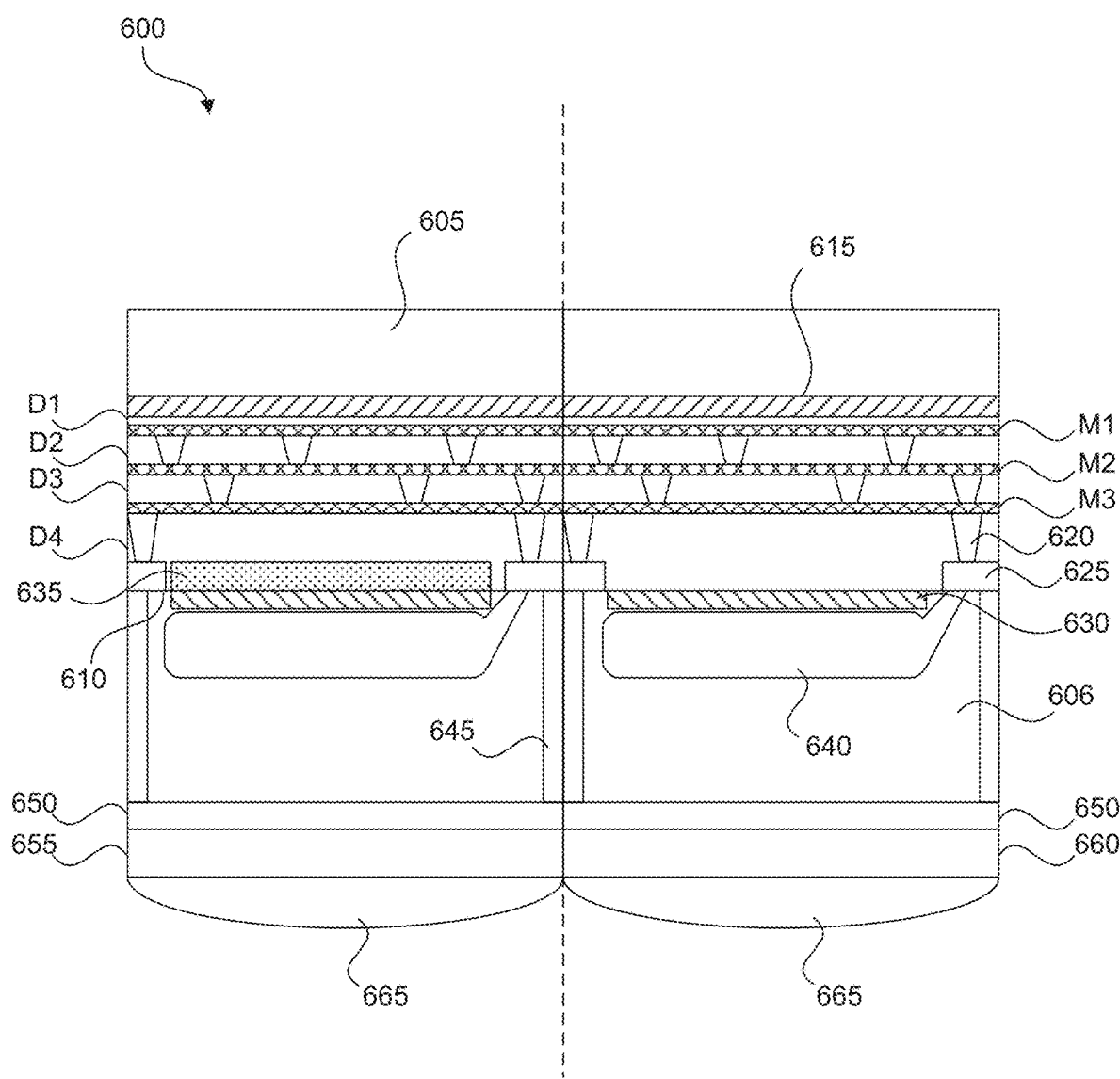
FIGS. 6a-6b are cross-sectional views of semiconductor photosensitive devices in accordance with another aspect of the present disclosure.

The foregoing description has generally described pixel arrays and associated circuitry for implementing the pixel arrays. Referring now to FIGS. 6A and B, a semiconductor structure forming the pixels in the pixel arrays and methods of manufacturing such a semiconductor structure will be described.

The pixel devices according to aspects of the present disclosure can increase the absorption of semiconductor materials for longer wavelengths as compared to traditional materials. In traditional semiconductor materials, longer wavelength penetrate deep into the material before the photons are absorbed. Therefore, in thin devices these wavelengths are challenging to detect. But, the present disclosure teaches enhanced semiconductor materials that increase the effective absorption resulting in improved detection of longer wavelengths (e.g. >1000 nm for silicon) within a thin semiconductor device layer. In addition by maintaining detector sensitivity while thinning the detecting thickness the response rate or response speed can also be increased.

Accordingly, photosensitive imager devices or pixels and associated methods are contemplated. Such devices provide, among other things, enhanced response in the near infrared light portion of the optical spectrum and improved response and quantum efficiency in converting electromagnetic radiation to electrical signals. Quantum efficiency can be defined as the percentage of photons that are converted into electrons.

There are two types of QE, internal and external. Internal QE (IQE) describes the percentage of absorbed photons that are converted into electrons within the device. External QE (EQE) is the measurement of this conversion and the electrons that are collected outside of the device. The EQE is always lower than the IQE since there will inevitably be recombination effects and optical losses (e.g. transmission and reflection losses). One reason for improved performance with photosensitive imager devices, particularly for back side illuminated sensors (BSI), is a higher fill factor or, in other words, the amount of light that can be collected in a single pixel. The various metal layers on top of a front side-illuminated sensor (FSI) limit the amount of light that can be collected in a pixel. As pixel sizes get smaller, the fill factor gets worse. A BSI photosensitive imager device can provide a more direct path for light to travel into the pixel, thus avoiding light blockage by the metal interconnect and dielectric layers on the top-side of the semiconductor substrate.

BSI and FSI broadband photosensitive diodes, pixels, and imagers capable of detecting visible as well as infrared electromagnetic radiation are contemplated, including associated methods of making such devices. A photosensitive diode can include a semiconductor substrate having multiple doped regions forming at least one junction, and a textured region coupled to the semiconductor substrate and positioned to interact with electromagnetic radiation. The semiconductor substrate and the textured region can be positioned such that incoming electromagnetic radiation passes through the semiconductor substrate before contacting the textured region. In another example, the semiconductor substrate and the textured region can be positioned such that the incoming electromagnetic radiation contacts the textured region before contacting the semiconductor substrate.

In one aspect the multiple doped regions can include at least one cathode region and at least one anode region. In some aspects, doped regions can include an n-type dopant and/or a p-type dopant, thereby creating a p-n junction. In other aspects, a photosensitive device can include an i-type region to form a p-i-n junction.

A photosensitive pixel can include a semiconductor substrate having multiple doped regions forming at least one junction, and a textured region coupled to the semiconductor substrate and positioned to interact with electromagnetic radiation. The semiconductor substrate and the textured region are positioned such that incoming electromagnetic radiation passes through the semiconductor substrate before contacting the textured region. Additionally, the photosensitive pixel also includes an electrical transfer element coupled to the semiconductor substrate and operable to transfer an electrical signal from the at least one junction. A photosensitive imager can include multiple photosensitive pixels. Additionally, an electrical transfer element can include a variety of devices, including without limitation, transistors, sensing nodes, transfer gates, transfer electrodes, and the like.

In a typical FSI imager, incident light enters the semiconductor device by first passing by transistors and metal circuitry. The light, however, can scatter off of the transistors and circuitry prior to entering the light sensing portion of the imager, thus causing optical loss and noise. A lens can be disposed on the topside of a FSI pixel to direct and focus the incident light to the light sensing active region of the device, thus partially avoiding the circuitry. In one aspect the lens can be a micro-lens. BSI imagers are configured to have the depletion region of the junction extending to the opposite side of the device. In one aspect, for example, incident light enters the device via the light sensing portion and is mostly absorbed prior to reaching the circuitry. BSI designs allow for smaller pixel architecture and a high fill factor for the imager. It should also be understood that devices according to aspects of the present disclosure can be incorporated into complimentary metal-oxide-semiconductor (CMOS) imager architectures or charge-coupled device (CCD) imager architectures.

Referring more specifically now to FIG. 6a, a BSI semiconductor architecture 600 is illustrated. The semiconductor structure includes a plurality of dielectric layers D1-D4 and a plurality of metal layers M1-M3. Vias 620 can be formed between the layers. Many of the structures in the semiconductor architecture are repeated, and thus each instance of a structure on one or more sides of the architecture is not individually called out.

A near-infrared pixel semiconductor structure is shown on the left side of the dotted line. A handle wafer or support substrate 605 can provide a base or support for the NIR pixel. The NIR pixel may comprise a semiconductor material 606 (e.g. a silicon base semiconductor bulk material) with a device surface 610, a p+ type 630 and an n– type 640 dopant incorporated into the semiconductor material forming at least one junction, an absorption enhanced region 635 formed within the material, a passivation layer 615, trench isolation regions 645, a lens 665, anti-reflective coating 650, and a narrow band pass filter 655 fabricated on a side of the pixel nearest to impinging light. The n– type dopant can form a pinned photodiode pinned to a transfer gate 625.

Another pixel (as shown on the right), such as a red, green or blue pixel for the visible spectrum, may comprise a semiconductor material 606 (e.g. a silicon base semiconductor bulk material), a p+ type 630 and n– type 640 dopant incorporated into the semiconductor material, a passivation layer 615, trench isolation regions 645, a lens 665, anti-reflective coating 650, and a typical color filter 660 and infrared-cut filter 660 built on top of the pixel.

Figure 6B:
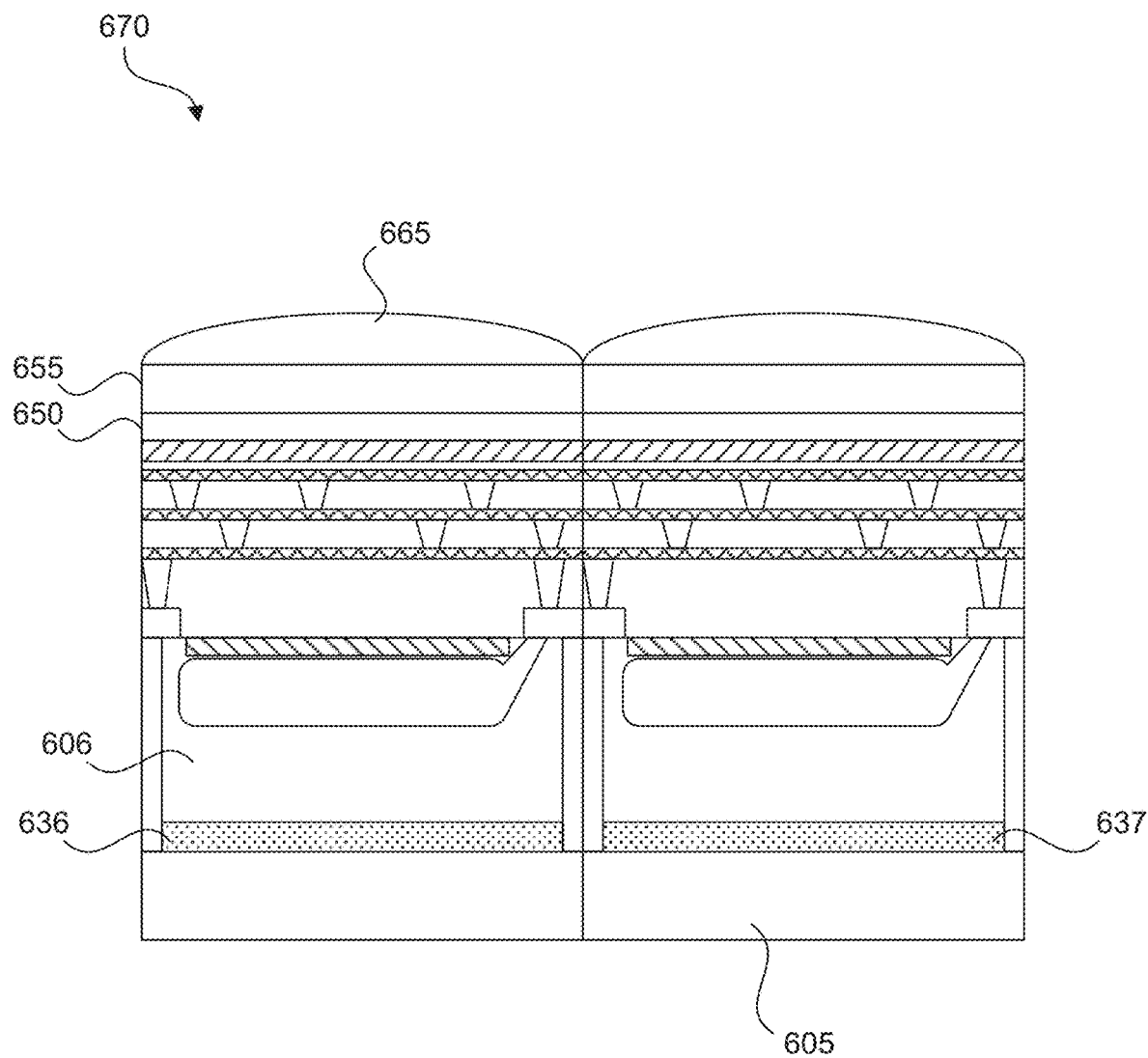

In a FSI embodiment shown in FIG. 6b, the RGB color pixels may further comprise an absorption enhanced region 637 formed at an interface on or within the semiconductor material 606. Also shown in this embodiment is a positioning of the absorption enhanced or textured region 636 on the NIR pixel (left side) and the R, G, or B pixel (right side) on an opposite side of the photodiode from the example shown in FIG. 6a. It is noted that, although not shown in this figure, the textured regions 636, 637 can also be positioned adjacent to the junctions or pixels.

The doped regions can have the same doping profile or different doping profiles, depending on the device. While the device shown contains multiple doped regions, it should be noted that other aspects containing one or more doped regions are considered to be within the present scope. Additionally, the semiconductor substrate can be doped, and thus can be considered to be a doped region in some aspects.

The semiconductor substrate and the textured region can be positioned such that incoming electromagnetic radiation passes through the semiconductor substrate before contacting the textured region, or can alternatively be positioned such that incoming electromagnetic radiation passes through the textured region before contacting the semiconductor substrate.

The various devices according to aspects of the present disclosure can exhibit increased quantum efficiency over traditional photosensitive devices. Any increase in the quantum efficiency makes a large difference in the signal to noise ratio. More complex structures can provide not only increased quantum efficiency but also good uniformity from pixel to pixel. In addition, devices of the present disclosure exhibit increased responsivity as compared to traditional photosensitive devices. For example, in one aspect the responsivity can be greater than or equal to 0.3 A/W for wavelengths greater than 1000 nm for semiconductor substrate that is less than 100 μm thick. In other embodiment the responsivity can be greater than 0.15 A/W for wavelengths greater than 1100 nm for semiconductor substrate that is less than 50 μm thick.

A variety of semiconductor materials are contemplated for use with the devices and methods according to aspects of the present disclosure. Non-limiting examples of such semiconductor materials can include group IV materials, compounds and alloys comprised of materials from groups II and VI, compounds and alloys comprised of materials from groups III and V, and combinations thereof. More specifically, exemplary group IV materials can include silicon, carbon (e.g. diamond), germanium, and combinations thereof. Various exemplary combinations of group IV materials can include silicon carbide (SiC) and silicon germanium (SiGe). In one specific aspect, the semiconductor material can be or include silicon. Exemplary silicon materials can include amorphous silicon (a-Si), microcrystalline silicon, multicrystalline silicon, and monocrystalline silicon, as well as other crystal types. In another aspect, the semiconductor material can include at least one of silicon, carbon, germanium, aluminum nitride, gallium nitride, indium gallium arsenide, aluminum gallium arsenide, and combinations thereof.

Exemplary combinations of group II-VI materials can include cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), cadmium zinc telluride (CdZnTe, CZT), mercury cadmium telluride (HgCdTe), mercury zinc telluride (HgZnTe), mercury zinc selenide (HgZnSe), and combinations thereof.

Exemplary combinations of group III-V materials can include aluminum antimonide (AlSb), aluminum arsenide (AlAs), aluminum nitride (AlN), aluminum phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP), aluminum gallium arsenide (AlGaAs, AlxGa1−xAs), indium gallium arsenide (InGaAs, InxGa1−xAs), indium gallium phosphide (InGaP), aluminum indium arsenide (AlInAs), aluminum indium antimonide (AlInSb), gallium arsenide nitride (GaAsN), gallium arsenide phosphide (GaAsP), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide antimonide (GaInNAsSb), gallium indium arsenide antimonide phosphide (GaInAsSbP), and combinations thereof.

The semiconductor substrate can be of any thickness that allows electromagnetic radiation detection and conversion functionality, and thus any such thickness of semiconductor material is considered to be within the present scope. In some aspects the textured region increases the efficiency of the device such that the semiconductor substrate can be thinner than has previously been possible. Decreasing the thickness of the semiconductor substrate reduces the amount of semiconductor material required to make such a device. In one aspect, for example, the semiconductor substrate has a thickness of from about 500 nm to about 50 µm. In another aspect, the semiconductor substrate has a thickness of less than or equal to about 100 µm. In yet another aspect, the semiconductor substrate has a thickness of from about 1 µm to about 10 µm. In a further aspect, the semiconductor substrate can have a thickness of from about 5 µm to about 50 µm. In yet a further aspect, the semiconductor substrate can have a thickness of from about 5 µm to about 10 µm.

Additionally, various types of semiconductor materials are contemplated, and any such material that can be incorporated into an electromagnetic radiation detection device is considered to be within the present scope. In one aspect, for example, the semiconductor material is monocrystalline. In another aspect, the semiconductor material is multicrystalline. In yet another aspect, the semiconductor material is microcrystalline. It is also contemplated that the semiconductor material can be amorphous. Specific nonlimiting examples include amorphous silicon or amorphous selenium.

The semiconductor materials of the present disclosure can also be made using a variety of manufacturing processes. In some cases the manufacturing procedures can affect the efficiency of the device, and may be taken into account in achieving a desired result. Exemplary manufacturing processes can include Czochralski (Cz) processes, magnetic Czochralski (mCz) processes, Float Zone (FZ) processes, epitaxial growth or deposition processes, and the like. It is contemplated that the semiconductor materials used in the present invention can be a combination of monocrystalline material with epitaxially grown layers formed thereon.

The textured region can function to diffuse electromagnetic radiation, to redirect electromagnetic radiation, and to absorb electromagnetic radiation, thus increasing the quantum efficiency of the device. In one aspect, electromagnetic radiation passing through the semiconductor substrate can contact the textured region. The textured region can include surface features to thus increase the effective absorption length of the photosensitive pixel. Such surface features can be micron-sized and/or nano-sized, and can be any shape or configurations. Non-limiting examples of such shapes and configurations include cones, pillars, pyramids, microlenses, quantum dots, inverted features, gratings, protrusions, and the like, including combinations thereof. Additionally, factors such as manipulating the feature sizes, dimensions, material type, dopant profiles, texture location, etc. can allow the diffusing region to be tunable for a specific wavelength. In one aspect, tuning the device can allow specific wavelengths or ranges of wavelengths to be absorbed. In another aspect, tuning the device can allow specific wavelengths or ranges of wavelengths to be reduced or eliminated via filtering.

Tuning can also be accomplished through the relative location of the texture region within the device, modifying the dopant profile(s) of regions within the device, dopant selection, and the like. Additionally, material composition near the textured region can create a wavelength specific photosensing pixel device. It should be noted that a wavelength specific photosensing pixel can differ from one pixel to the next, and can be incorporated into an imaging array.

Textured regions according to aspects of the present disclosure can allow a photosensitive device to experience multiple passes of incident electromagnetic radiation within the device, particularly at longer wavelengths (i.e. infrared). Such internal reflection increases the effective absorption length to be greater than the thickness of the semiconductor substrate. This increase in absorption length increases the quantum efficiency of the device, leading to an improved signal to noise ratio.

The materials used for making the textured region can vary depending on the design and the desired characteristics of the device. As such, any material that can be utilized in the construction of a textured region is considered to be within the present scope. In one aspect, a portion of the semiconductor layer can be textured to form the textured region. The texturing process can texture an entire surface of the semiconductor layer or only a portion of the semiconductor layer surface.

In addition to surface features, the textured region can have a surface morphology that is designed to focus or otherwise direct electromagnetic radiation. For example, in one aspect the textured region has a surface morphology operable to direct electromagnetic radiation into the semiconductor substrate. Non-limiting examples of various surface morphologies include sloping, pyramidal, inverted pyramidal, spherical, square, rectangular, parabolic, asymmetric, symmetric, and the like, including combinations thereof.

It should be noted that, while the techniques described herein have been used to enhance the absorption of infrared and red light radiation, they are also applicable to visible light as the thickness of the silicon layer becomes thinner. Scattering and multiple internal reflections can also be used to increase the absorption of yellow, green and even blue light that will not be totally absorbed in single passes within thin silicon layers. These techniques can be applied then to visible imagers with thin silicon absorption layers.

The textured region, including surface features as well as surface morphologies, can be formed by various techniques, including plasma etching, reactive ion etching, porous silicon etching, lasing, chemical etching (e.g. anisotropic etching, isotropic etching), nanoimprinting, material deposition, selective epitaxial growth, and the like. In one aspect, the texturing process can be performed during the manufacture of the photosensitive device. In another aspect, the texturing process can be performed on a photosensitive device that has previously been made. For example, a CMOS, CCD, or other photosensitive element can be textured following manufacture. In this case, material layers may be removed from the photosensitive element to expose the semiconductor substrate upon which a textured region can be formed.

One effective method of producing a textured region is through laser processing. Such laser processing allows discrete locations of the passivation region or other substrate to be textured. A variety of techniques of laser processing to form a textured region are contemplated, and any technique capable of forming such a region should be considered to be within the present scope. Laser treatment or processing can allow, among other things, enhanced absorption properties and thus increased electromagnetic radiation focusing and detection. The laser treated region can be associated with the surface nearest the impinging electromagnetic radiation or, in the case of BSI devices, the laser treated surface can be associated with a surface opposite in relation to impinging electromagnetic radiation, thereby allowing the radiation to pass through the semiconductor substrate before it hits the laser treated region.

In one aspect, for example, a target region of the semiconductor material can be irradiated with laser radiation to form a textured region. Examples of such processing have been described in further detail in U.S. Pat. Nos. 7,057,256, 7,354,792 and 7,442,629, which are incorporated herein by reference in their entireties. Briefly, a surface of a substrate material is irradiated with laser radiation to form a textured or surface modified region. Such laser processing can occur with or without a dopant material. In those aspects whereby a dopant is used, the laser can be directed through a dopant carrier and onto the substrate surface. In this way, dopant from the dopant carrier is introduced into the target region of the substrate material. Such a region incorporated into a substrate material can have various benefits in accordance with aspects of the present disclosure. For example, the target region typically has a textured surface that increases the surface area of the laser treated region and increases the probability of radiation absorption via the mechanisms described herein. In one aspect, such a target region is a substantially textured surface including micron-sized and/or nano-sized surface features that have been generated by the laser texturing. In another aspect, irradiating the surface of the substrate material includes exposing the laser radiation to a dopant such that irradiation incorporates the dopant into the substrate. Various dopant materials are known in the art, and are discussed in more detail herein.

Thus the surface of the substrate or passivation region is chemically and/or structurally altered by the laser treatment, which may, in some aspects, result in the formation of surface features appearing as microstructures or patterned areas on the surface and, if a dopant is used, the incorporation of such dopants into the substrate material. In some aspects, the features or microstructures can be on the order of 50 nm to 20 μm in size and can assist in the absorption of electromagnetic radiation. In other words, the textured surface can increase the probability of incident radiation being absorbed.

The type of laser radiation used to surface modify a material can vary depending on the material and the intended modification. Any laser radiation known in the art can be used with the devices and methods of the present disclosure. There are a number of laser characteristics, however, that can affect the surface modification process and/or the resulting product including, but not limited to the wavelength of the laser radiation, pulse width, pulse fluence, pulse frequency, polarization, laser propagation direction relative to the semiconductor material, etc. In one aspect, a laser can be configured to provide pulsatile lasing of a material. A short-pulsed laser is one capable of producing femtosecond, picosecond and/or nanosecond pulse durations. Laser pulses can have a central wavelength in a range of about from about 10 nm to about 8 μm, and more specifically from about 200 nm to about 1200 nm. The pulse width of the laser radiation can be in a range of from about tens of femtoseconds to about hundreds of nanoseconds. In one aspect, laser pulse widths can be in the range of from about 50 femtoseconds to about 50 picoseconds. In another aspect, laser pulse widths can be in the range of from about 50 picoseconds to 100 nanoseconds. In another aspect, laser pulse widths are in the range of from about 50 to 500 femtoseconds.

The number of laser pulses irradiating a target region can be in a range of from about 1 to about 2000. In one aspect, the number of laser pulses irradiating a target region can be from about 2 to about 1000. Further, the repetition rate or frequency of the pulses can be selected to be in a range of from about 10 Hz to about 10 μHz, or in a range of from about 1 kHz to about 1 MHz, or in a range from about 10 Hz to about 1 kHz. Moreover, the fluence of each laser pulse can be in a range of from about 1 $kJ/m^2$ to about 20 $kJ/m^2$, or in a range of from about 3 $kJ/m^2$ to about 8 $kJ/m^2$.

A variety of dopant materials are contemplated for both the formation of the multiple doped regions and incorporation by a texturing technique, and any such dopant that can be used in such processes to surface modify a material is considered to be within the present scope. It should be noted that the particular dopant utilized can vary depending on the material being doped, as well as the intended use of the resulting material. For example, the selection of potential dopants may differ depending on whether or not tuning of the photosensitive device is desired.

A dopant can be either charge donating or accepting dopant species. More specifically, an electron donating or a hole donating species can cause a region to become more positive or negative in polarity as compared to the semiconductor substrate. In one aspect, for example, the doped region can be p-doped. In another aspect the doped region can be n-doped. A highly doped region can also be formed on or near the doped region to create a pinned diode. In one non-limiting example, the semiconductor substrate can be negative in polarity, and a doped region and a highly doped region can be doped with p+ and n dopants respectively. In some aspects, variations of n(--), n(-), n(+), n(++), p(--), p(-), p(+), or p(++) type doping of the regions can be used. It should be noted that in one aspect the highly doped region can be a textured region. In other words, textured surface features can be formed on or in a highly doped region. In another aspect, at least a portion of the textured region, or the material from which the textured region is generated, can be doped with a dopant to generate a back surface field. A back surface field can function to impede the movement of photo-generated carriers from the junction toward the textured region.

In one aspect, non-limiting examples of dopant materials can include S, F, B, P, N, As, Se, Te, Ge, Ar, Ga, In, Sb, and combinations thereof. It should be noted that the scope of dopant materials should include, not only the dopant materials themselves, but also materials in forms that deliver such dopants (i.e. dopant carriers). For example, S dopant materials includes not only S, but also any material capable being used to dope S into the target region, such as, for example, $H_2S$, $SF_6$, $SO_2$, and the like, including combinations thereof. In one specific aspect, the dopant can be S. Sulfur can be present at an ion dosage level of between about $5 \times 10^{14}$ and about $1 \times 10^{16}$ ions/cm$^2$. Non-limiting examples of fluorine-containing compounds can include $ClF_3$, $PF_5$, $F_2$ $SF_6$, $BF_3$, $GeF_4$, $WF_6$, $SiF_4$, HF, $CF_4$, $CHF_3$, $CH_2F_2$, $CH_3F$, $C_2F_6$, $C_2HF_5$, $C_3F_8$, $C_4F_8$, $NF_3$, and the like, including combinations thereof. Non-limiting examples of boron-containing compounds can include $B(CH_3)_3$, $BF_3$, $BCl_3$, BN, $C_2B_{10}H_{12}$, borosilica, $B_2H_6$, and the like, including combinations thereof. Non-limiting examples of phosphorous-containing compounds can include $PF_5$, $PH_3$, and the like, including combinations thereof. Non-limiting examples of chlorine-containing compounds can include $Cl_2$, $SiH_2Cl_2$, HCl, $SiCl_4$, and the like, including combinations thereof. Dopants can also include arsenic-containing compounds such as $AsH_3$ and the like, as well as antimony-containing compounds. Additionally, dopant materials can include mixtures or combinations across dopant groups, i.e. a sulfur-containing compound mixed with a chlorine-containing compound. In one aspect, the dopant material can have a density that is greater than air. In one specific aspect, the dopant material can include Se, $H_2S$, $SF_6$, or mixtures thereof. In yet another specific aspect, the dopant can be $SF_6$ and can have a predetermined concentration range of about $5.0 \times 10^{-8}$ mol/cm$^3$ to about $5.0 \times 10^{-4}$ mol/cm$^3$. As one non-limiting example, $SF_6$ gas is a good carrier for the incorporation of sulfur into the semiconductor material via a laser process without significant adverse effects on the material. Additionally, it is noted that dopants can also be liquid solutions of n-type or p-type dopant materials dissolved in a solution such as water, alcohol, or an acid or basic solution. Dopants can also be solid materials applied as a powder or as a suspension dried onto the wafer.

As a further processing note, the semiconductor substrate can be annealed for a variety of reasons, including dopant activation, semiconductor damage repair, and the like. The semiconductor substrate can be annealed prior to texturing, following texturing, during texturing, or any combination thereof. Annealing can enhance the semiconductive properties of the device, including increasing the photoresponse properties of the semiconductor materials by reducing any imperfections in the material. Additionally, annealing can reduce damage that may occur during the texturing process. Although any known anneal can be beneficial and would be considered to be within the present scope, annealing at lower temperatures can be particularly useful. Such a "low temperature" anneal can greatly enhance the external quantum efficiency of devices utilizing such materials. In one aspect, for example, the semiconductor substrate can be annealed to a temperature of from about 300° C. to about 1100 C°. In another aspect, the semiconductor substrate can be annealed to a temperature of from about 500° C. to about 900° C. In yet another aspect, the semiconductor substrate can be annealed to a temperature of from about 700° C. to about 800° C. In a further aspect, the semiconductor substrate can be annealed to a temperature that is less than or equal to about 850° C.

The duration of the annealing procedure can vary according to the specific type of anneal being performed, as well as according to the materials being used. For example, rapid annealing processes can be used, and as such, the duration of the anneal may be shorter as compared to other techniques. Various rapid thermal anneal techniques are known, all of which should be considered to be within the present scope. In one aspect, the semiconductor substrate can be annealed by a rapid annealing process for a duration of greater than or equal to about 1 µs. In another aspect, the duration of the rapid annealing process can be from about 1 µs to about 1 ms. As another example, a baking or furnace anneal process can be used having durations that may be longer compared to a rapid anneal. In one aspect, for example, the semiconductor substrate can be annealed by a baking anneal process for a duration of greater than or equal to about 1 ms to several hours.

Various types of passivation region configurations are contemplated, and any configuration that can be incorporated into a photosensitive device is considered to be within the present scope. One benefit to such a passivation region pertains to the isolation provided between the textured region and the doped regions that form the junction. In one aspect, for example, the passivation region can be positioned to physically isolate the textured region from the junction. In this way, the creation of the textured region can be isolated from the doped regions, thus precluding undesirable effects of the texturing process from affecting the junction. In another aspect, the passivation region can be a dielectric material, and thus the passivation region could be used to electrically isolate the textured region from the junction. In some cases, the passivation region is coupled directly to at least one of the doped regions forming the junction.

The passivation region can be made from a variety of materials, and such materials can vary depending on the device design and desired characteristics. Non-limiting examples of such materials can include oxides, nitrides, oxynitrides, and the like, including combinations thereof. In one specific aspect, the passivation region includes an oxide. Additionally, the passivation region can be of various thicknesses. In one aspect, for example, the passivation region has a thickness of from about 100 nm to about 1 micron. In another aspect, the passivation region has a thickness of from about 5 nm to about 100 nm. In yet another aspect, the passivation region has a thickness of from about 20 nm to about 50 nm.

The devices according to aspects of the present disclosure can additionally include one or more reflecting regions. For example, a photosensitive imager device can include a reflecting region coupled to the textured region. The reflecting region can be deposited over the entire textured region or only over a portion of the textured region. In some aspects, the reflecting region can be deposited over a larger area of the device than the textured region. The reflecting region can be positioned to reflect electromagnetic radiation passing through the texture region back through the textured region. In other words and as an example, as electromagnetic radiation passes into the semiconductor substrate a portion of electromagnetic radiation that is not absorbed contacts the textured region. Of that portion of electromagnetic radiation that contacts the textured region, a smaller portion may pass though the textured region to strike the reflecting region and be reflected back through the textured region toward the semiconductor substrate.

A variety of reflective materials can be utilized in constructing the reflecting region, and any such material capable of incorporation into a photosensitive device is considered to be within the present scope. Non-limiting examples of such materials include a Bragg reflector, a metal reflector, a metal reflector over a dielectric material, a transparent conductive oxide such as zinc oxide, indium oxide, or tin oxide, and the like, including combinations thereof. Non-limiting examples of metal reflector materials can include silver, aluminum, gold, platinum, reflective metal nitrides, reflective metal oxides, and the like, including combinations thereof.

The textured surface of a metal on a roughened oxide can act as a diffusive scattering site for the incident electromagnetic radiation and also as a mirror-like reflector. Other aspects can utilize porous materials for the texturing. Porous polysilicon, for example, can be oxidized or oxide deposited and a reflective region such as a metal reflector can be associated therewith to provide a scattering and reflecting surface. In another aspect, aluminum can be subjected to anodic oxidation to provide porous aluminum oxide, a high dielectric constant insulator. This insulator can be coated with aluminum or other metals to provide a scattering and reflecting surface.

In one specific aspect, a reflective region can include a transparent conductive oxide, an oxide, and a metal layer. The transparent oxide can be textured and a metal reflector deposited thereupon. The textured surface of the metal on a roughened transparent conductive oxide can act as a diffusive scattering site for the incident electromagnetic radiation.

In another specific aspect, a Bragg reflector can be utilized as a reflective region. A Bragg reflector is a structure formed from multiple layers of alternating materials with varying refractive indexes, or by a periodic variation of some characteristic (e.g. height) of a dielectric waveguide, resulting in periodic variation in the effective refractive index in the guide. Each layer boundary causes a partial reflection of an optical wave. For waves whose wavelength is close to four times the optical thickness of the layers, the many reflections combine with constructive interference, and the layers act as a high-quality reflector. Thus the coherent super-positioning of reflected and transmitted light from multiple interfaces in the structure interfere so as to provide the desired reflective, transmissive, and absorptive behavior. In one aspect, the Bragg reflector layers can be alternating layers of silicon dioxide and silicon. Because of the high refractive index difference between silicon and silicon dioxide, and the thickness of these layers, this structure can be fairly low loss even in regions where bulk silicon absorbs appreciably. Additionally, because of the large refractive index difference, the optical thickness of the entire layer set can be thinner, resulting in a broader-band behavior and fewer fabrications steps.

Additional scattering can be provided by positioning a textured forward scattering layer on the side of the pixel opposing the doped photodiode regions or on the illuminated side. These forward scattering layers can be, without limitation, textured oxides or polysilicon without a reflector. These layers can be spaced away from the back side surface of the pixel and would provide scattering of the light in addition to that provided by layers on the front side of the pixel adjacent to the photodiode and transistor doped regions in the case of BSI architectures, or spaced away from the front side surface of the pixel and would provide scattering of the light in addition to that provided by layers on the back side of the pixel in the case of FSI architectures. Various features and aspects of BSI and FSI architectures are further described in U.S. patent application Ser. No. 13/050,557, filed on Mar. 17, 2011, which is incorporated herein by reference in its entirety. Additional relevant details are further described in U.S. patent application Ser. No. 12/885,158, filed on Sep. 17, 2010, which is incorporated herein by reference in its entirety.

Figure 7:
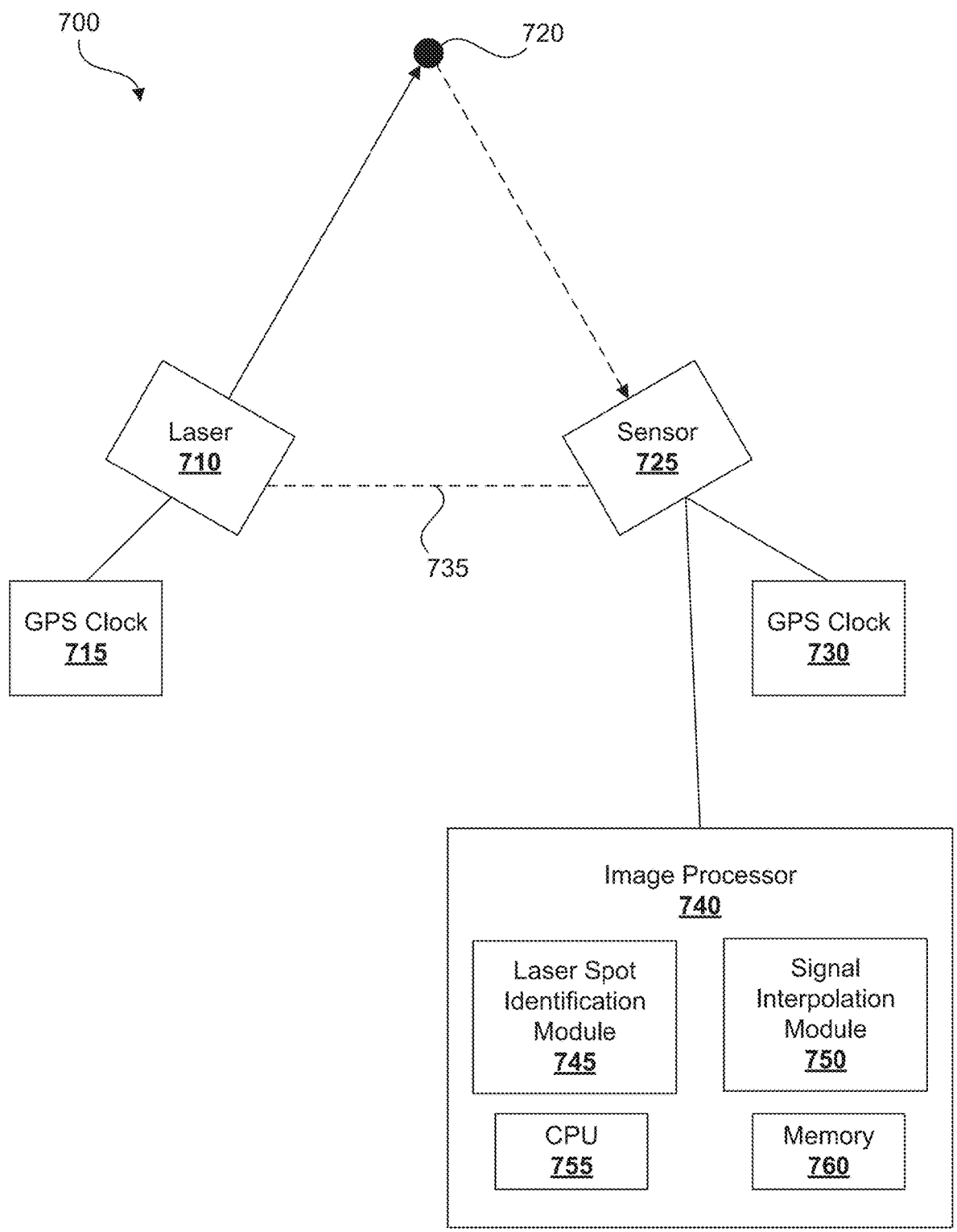
FIG. 7 is a block diagram of a system for detecting and processing visible and infrared light in accordance with another aspect of the present disclosure.

In consideration of the foregoing description, devices, systems, and methods can be implemented for detecting light with a sensor including NIR and RGB pixels and processing the detected light. For example, as shown in FIG. 7 a system 700 may include a sensor 725 having NIR and RGB pixels and a light source 710 for emitting NIR light towards a target 720. In one example, the light source comprises a laser diode. If the laser diode and sensor are in a same system, or in other words have a direct communication channel 735 there between, synchronizing of capture of light from the diode by the NIR pixel can be easily accomplished. If, however, the sensor and laser diode are in separate systems and/or in different locations, synchronization of timing can be achieved via one or more global position system (GPS) clocks 715, 730. Where a GPS clock is used, a timing of laser pulses with respect to a GPS clock time can be determined. The timing of the laser pulses with respect to the GPS clock time can be communicated directly or indirectly to the sensor. The sensor can include a GPS clock and logic for timing light detection with the timing of the laser pulses based on the GPS clock time.

As described above, one problem with conventional imagers in providing a see-spot capability for a laser designator system is capturing the reflected laser pulse energy. Specifically, many imagers either image a surrounding background imagery of the target or sacrifice the background imagery and image the laser spot. As a result, a human operator does not have the benefit of both being able to see the background imagery and the laser spot to determine accuracy of the target. In some instances, multiple separate sensors are used, one for detecting the laser spot and another for detecting the surrounding imagery. The image output from the two separate sensors is digitally merged or fused into one composite image. However, the field-of-view (FOV) is not exactly same for the two sensors and there is a registration error. Particularly where high accuracy aiming or targeting is desired, the registration error could lead the human operator viewing the composite image to either believe the laser is pointing to a different target than the actual target and/or to act upon an incorrect target, such as by firing a missile, for example.

The imaging device or sensor described herein can provide the benefits of imaging both the laser spot and the background imagery without registration errors. Image outputs from the NIR and RGB pixels in a same sensor can be combined into a single composite image by an image processor 740. The image processor can include a central processing unit (CPU) 755, memory 760, and various modules for processing images.

In image processing by the image processor, visible light image data can pass through a signal interpolation module 750 to estimate the signal level of a missed green pixel (which has been replaced by 1064 nm NIR pixel, at least in a bayer pattern pixel array). The image processor can compensate the visible light for the missed green pixel based on the estimated signal level. The visible light image data can then be similar to that detected by a normal "bayer" pattern pixel array. The raw visible light image data can pass through a CMOS image processing pipeline for final output of a color image. This color image may include the background or scenery surrounding the laser spot.

After readout of each frame, the NIR pixel image (image size N×M) can pass through a laser spot identification module 745. The output of the laser spot identification module can be the laser spot center coordinate, spot size, etc. The laser spot identification module can improve the identification of the laser spot via various types of image processing, such as sharpening, contrast enhancement, etc. Human eye identification may also be possible for low ambient background light conditions without the use of the laser spot identification module.

The laser spot can then be rendered on the RGB image to indicate the location of laser spot relative to the visual scene. For example, the laser spot can be extracted from the NIR pixel image and inserted into the color image. As another example, the laser spot can be recreated or simulated in or on the color image. As another example, the laser spot can be overlayed onto the color image. More specifically, the NIR pixel image can be superimposed over the color image. The superimposition can be performed using optics, the sensor device itself, or the image processor. While the RGB and NIR pixels are in a same array and can avoid field of view issues, a detected light signal from the NIR pixel can be processed separately from a detected light signal from the RGB pixels to enhance and/or identify the laser spot before combining with the RGB pixels. A signal detected by the NIR pixel may include the laser spot and surrounding noise. Thus, at least in some examples, it may be desirable to identify and select the laser spot for combination with the RGB image without including any noise or other imagery surrounding the laser spot. In some other examples, an infrared and RGB image can be directly combined without any intervening processing steps.

The above operations can be performed at the sensor chip level or at a system level. If the operation or operations are done at the chip level, a frame memory (with size N×M pixel) can be provided for the NIR pixel array. Several rows of line memory can also be provided for the RGB pixels. For real time image data output, the previous frame's laser spot location can be drawn onto the current frame's output color image. A short period of time between color frames may elapse, or one or more color frames may be obtained, while a whole frame of the NIR image is obtained. With the global shutter and pulsed NIR light acquisition, the sensor will obtain the whole frame of the NIR image before the laser spot identification module can start searching for the laser spot. Therefore, there may be one frame delay on the laser spot. If a human eye is used to identify the laser spot on the image, the system can operate without frame memory and there will not be a one frame lag on the laser spot relative to the normal scene.

Figure 8A:
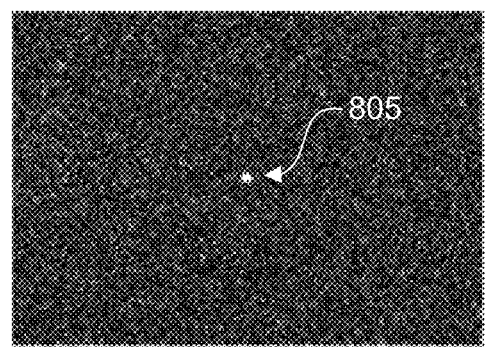
FIGS. 8a-8c are computer simulated images of laser spot detection, visible light detection, and a composite image in accordance with an aspect of the present disclosure.
Figure 8B:
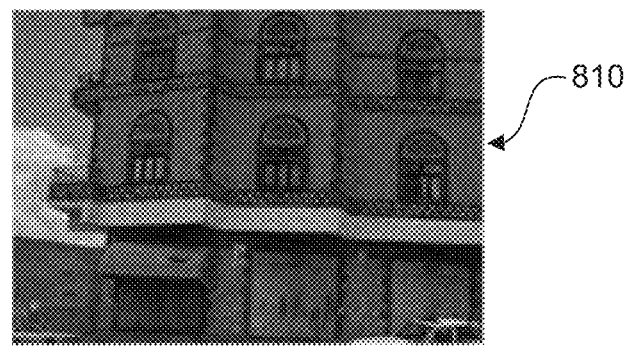
Figure 8C:
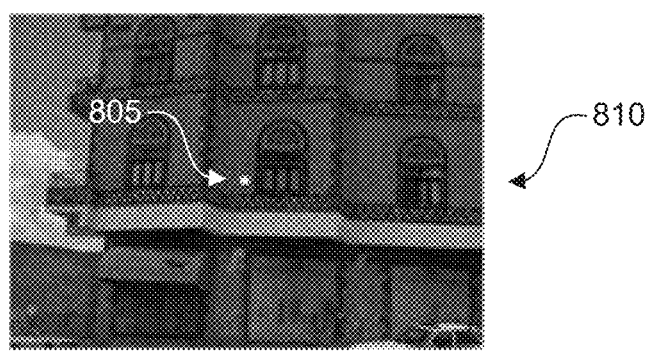

FIGS. 8a-8c illustrate computer simulated images output from a NIR pixel and RGB pixels as disclosed herein. FIG. 8a depicts output from a NIR pixel synchronized with a NIR laser pulse. A laser spot 805 is discernable from background noise in the image. Synchronizing the NIR pixel light capture with the laser pulse can substantially reduce the noise in the image and increase the discernability of the laser spot among any noise, particularly during bright ambient light conditions. FIG. 8b depicts output from RGB pixels, including a background image 810. FIG. 8c depicts a composite image including both the identified laser spot 805 and the background image 810.

Figure 9:
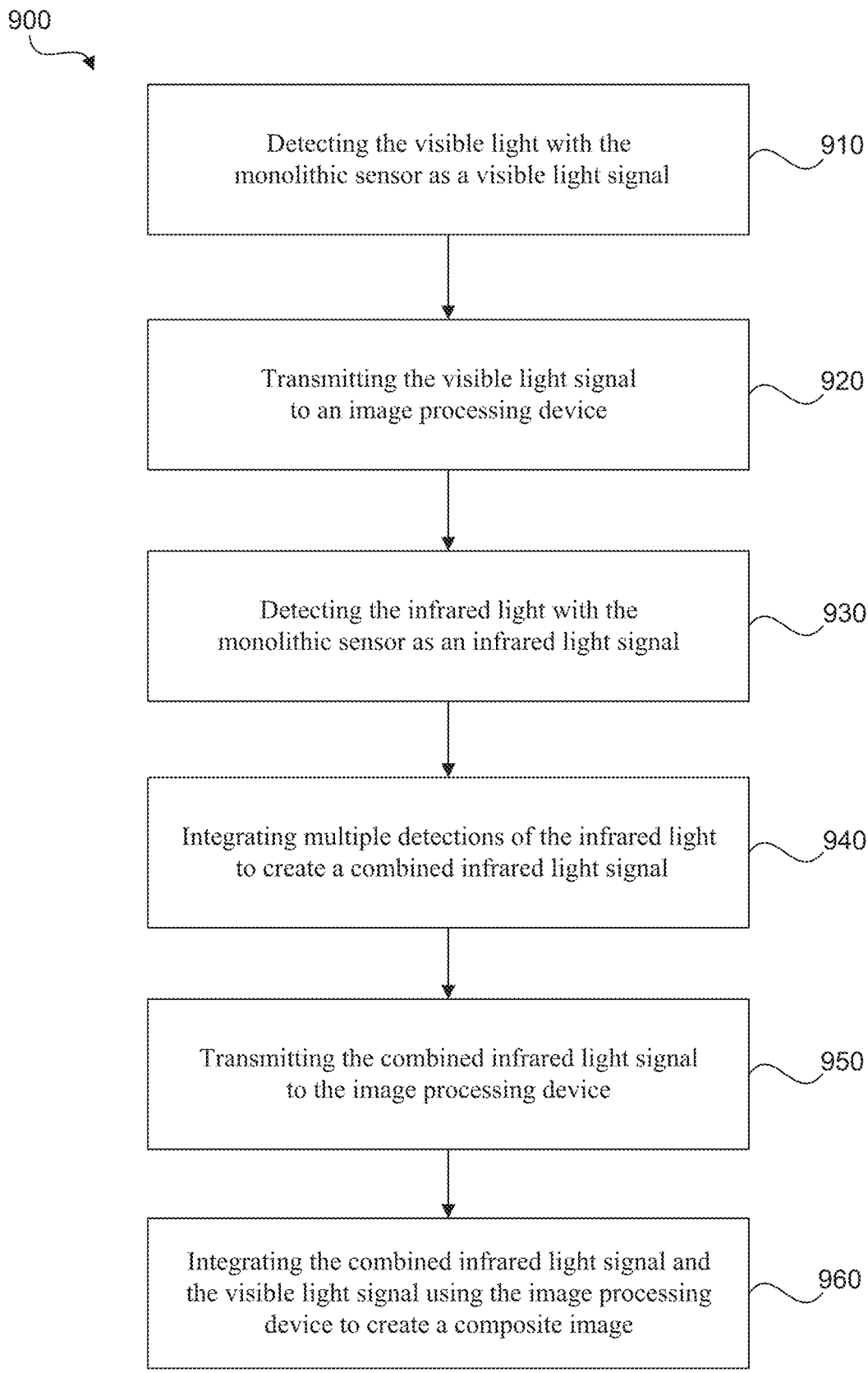
FIG. 9 is a flow diagram of a method for creating a composite image of detected infrared and visible light with a monolithic sensor in accordance with an aspect of the present disclosure.

Referring to FIG. 9, a flow diagram of an example method 900 for creating a composite image of detected infrared and visible light with a monolithic sensor is illustrated. The method includes detecting 910 the visible light with the monolithic sensor as a visible light signal and transmitting 920 the visible light signal to an image processing device. The infrared light is detected 930 with the monolithic sensor as an infrared light signal. Multiple detections of the infrared light are integrated 940 to create a combined infrared light signal. The combined infrared light signal is transmitted 950 to the image processing device and is integrated 960 with the visible light signal using the image processing device to create a composite image.

In an example method, detecting the visible light with the monolithic sensor as a visible light signal may comprise substantially continuously detecting the visible light. In another example method detecting the infrared light with the monolithic sensor as an infrared light signal may comprise detecting the infrared light substantially synchronously with a pulse of an infrared light source. In a more specific example, detecting the infrared light with the monolithic sensor as an infrared light signal may comprise detecting the infrared light substantially synchronously with a pulse of an infrared light source during bright ambient light conditions. In an alternate example, detecting the infrared light with the monolithic sensor as an infrared light signal may comprise substantially continuously detecting the infrared light during low ambient light conditions.

Figure 10:
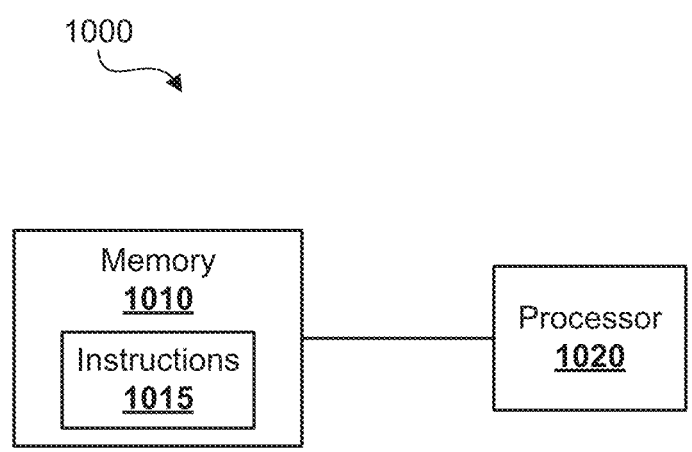
FIG. 10 is a block diagram of a system for processing visible and infrared light in accordance with another aspect of the present disclosure.

Referring to FIG. 10, a system 1000 and/or method can be implemented using a memory 1010, processor 1020, and/or computer readable medium. For example, an article of manufacture can include a memory or computer usable storage medium having computer readable program code or instructions 1015 embodied therein for processing output from NIR and RGB pixels to identify a laser spot and output a composite image including a background and the laser spot. The instructions can further enable synchronization of a NIR pixel with a laser pulse and other control operations of the NIR and RGB pixels (including switching the NIR pixel from global shutter mode to rolling shutter mode). The instructions may comprise computer readable program code capable of performing the operations of the methods described. In another example, the memory can include portable memory containing installation files from which software can be installed or remote memory from which installation filed can be downloaded. Also, program instructions stored in the memory can be embodied in installation files or installed files.

The methods and systems of certain embodiments may be implemented in hardware, software, firmware, or combinations thereof. In one embodiment, a method can be executed by software or firmware that is stored in a memory and that is executed by a suitable instruction execution system. If implemented in hardware, as in an alternative embodiment, the method can be implemented with any suitable technology that is well known in the art.

Also within the scope of an embodiment is the implementation of a program or code that can be stored in a non-transitory machine-readable medium to permit a computer to perform any of the methods described above.

Various techniques, or certain aspects or portions thereof, may take the form of program code (i.e., instructions) embodied in tangible media, such as floppy diskettes, CD-ROMs, DVDs, hard drives, or any other machine-readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and non-volatile memory and/or storage elements), at least one input device, and at least one output device. One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

Some of the functional units described in this specification have been labeled as modules, in order to more particularly emphasize their implementation independence. The various modules, engines, tools, or modules discussed herein may be, for example, software, firmware, commands, data files, programs, code, instructions, or the like, and may also include suitable mechanisms. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more blocks of computer instructions, which may be organized as an object, procedure, or function. Nevertheless, the executables of an identified module need not be physically located together, but may comprise disparate instructions stored in different locations which comprise the module and achieve the stated purpose for the module when joined logically together.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices. The modules may be passive or active, including agents operable to perform desired functions.

The modules can also be a combination of hardware and software. In an example configuration, the hardware can be a processor and memory while the software can be instructions stored in the memory.

It is to be understood that the above-described arrangements are only illustrative of the application of the principles of the present disclosure. Numerous modifications and alternative arrangements may be devised by those skilled in the art without departing from the spirit and scope of the present disclosure and the appended claims are intended to cover such modifications and arrangements. Thus, while the present disclosure has been described above with particularity and detail in connection with what is presently deemed to be the most practical embodiments of the disclosure, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A backside illuminated monolithic image sensor for detecting infrared and visible light, comprising:
   a semiconductor substrate;
   a semiconductor layer coupled to the semiconductor substrate, the semiconductor layer comprising silicon and having a device surface opposite the semiconductor substrate;
   an array of pixels comprising:
      at least one visible light pixel formed within the semiconductor layer;
      an infrared pixel formed within the semiconductor layer in proximity to the visible light pixel;
   a light diffusing region coupled to the infrared pixel and positioned to interact with electromagnetic radiation; and
   a global shutter coupled to said infrared pixel and configured to allow simultaneous capture of an entire field of view of the array.

2. The sensor of claim 1 wherein the light diffusing region is a textured region positioned between the infrared pixel and the semiconductor substrate.

3. The sensor of claim 1, wherein the light diffusing region is a textured region, wherein the infrared pixel is positioned between the textured region and the semiconductor substrate.

4. The sensor of claim 1, wherein the at least one visible light pixel comprises a plurality of visible light pixels each being configured to detect a different color of visible light.

5. The sensor of claim 1, wherein the infrared pixel is configured to detect infrared light having a wavelength of greater than 1000 nm.

6. The sensor of claim 1, further comprising an infrared narrow bandpass filter coupled to the infrared pixel.

7. The sensor of claim 1, further comprising an image processor for combining a first output from the infrared pixel with a second output from the visible light pixel to form a composite image.

8. The sensor of claim 1, further comprising circuitry for synchronizing light capture of the infrared pixel with a pulse frequency of an infrared radiation source.

9. The sensor of claim 1, further comprising circuitry for capturing signals generated by the infrared pixel in response to detection of one or more pulses of infrared light from an infrared radiation source.

10. The sensor of claim 9, further comprising circuitry for integrating the signals generated by the infrared pixel across multiple pulses of infrared radiation from the infrared radiation source to create a composite infrared signal image.

11. The sensor of claim 9, wherein said infrared radiation source is a laser source.

12. The sensor of claim 1, wherein the light diffusing region is a textured region formed by one of etching, lasing, nanoimprinting, material deposition, epitaxial growth, and combinations thereof.

13. The sensor of claim 1, wherein the light diffusing region is a textured region that exhibits a plurality of surface features comprising one of pyramids, inverted features, and combinations thereof.

14. The sensor of claim 1, further comprising circuitry for capturing signals generated by the infrared light pixel in response to detection of one or more pulses of infrared radiation from an infrared radiation source.

15. The sensor of claim 1, further comprising an infrared radiation source for generating one or more pulses of infrared radiation.

16. The sensor of claim 15, wherein the global shutter is configured to activate signal integration in substantial synchronization with emission of infrared pulses generated by the infrared radiation source and to discontinue signal integration between said infrared pulses generated by said infrared radiation source.

17. The sensor of claim 1, wherein operation of said visible light pixel is independent from activation and deactivation of said infrared light pixel.

18. The sensor of claim 1, wherein the semiconductor substrate exhibits a thickness less than about 50 microns.

19. The sensor of claim 1, wherein the semiconductor substrate exhibits a thickness in a range from about 1 micron to about 50 microns.

* * * * *